United States Patent
Poechmueller

(10) Patent No.: US 7,298,174 B2
(45) Date of Patent: Nov. 20, 2007

(54) CIRCUIT AND METHOD FOR GENERATING AN OUTPUT SIGNAL

(75) Inventor: Peter Poechmueller, Dresden (DE)

(73) Assignee: Infineon Technologies AG, Munich (DE)

( * ) Notice: Subject to any disclaimer, the term of this patent is extended or adjusted under 35 U.S.C. 154(b) by 98 days.

(21) Appl. No.: 11/237,398

(22) Filed: Sep. 28, 2005

(65) Prior Publication Data

US 2006/0071689 A1 Apr. 6, 2006

(30) Foreign Application Priority Data

Sep. 30, 2004 (DE) .................. 10 2004 047 664

(51) Int. Cl.
*H03K 19/094* (2006.01)
*H03K 19/0175* (2006.01)

(52) U.S. Cl. .................. 326/83; 326/27; 326/82

(58) Field of Classification Search ............ 326/26–27, 326/30, 82–83; 327/107–112
See application file for complete search history.

(56) References Cited

U.S. PATENT DOCUMENTS

| 5,574,633 | A | 11/1996 | Prater |
| 5,604,454 | A | 2/1997 | Maguire et al. |
| 5,963,047 | A * | 10/1999 | Kwong et al. ................ 326/27 |
| 6,222,390 | B1 * | 4/2001 | Huang .......................... 326/88 |
| 6,307,417 | B1 | 10/2001 | Proebsting |
| 6,356,115 | B1 | 3/2002 | Dabral et al. |
| 6,956,404 | B2 | 10/2005 | Schneider et al. |
| 7,019,553 | B2 * | 3/2006 | Blodgett et al. .............. 326/30 |

FOREIGN PATENT DOCUMENTS

| DE | 10316579 | 11/2004 |
| EP | 1443650 | 8/2004 |
| JP | 09-027742 | 1/1997 |
| JP | 10-055681 | 2/1998 |

* cited by examiner

*Primary Examiner*—Anh Q. Tran
(74) *Attorney, Agent, or Firm*—Patterson & Sheridan, L.L.P.

(57) ABSTRACT

A circuit comprises an output terminal, an output driver for providing an output signal at the output terminal, a switching device for producing one or more connections of the output terminal to a respective fixed or variable potential, and a control device for controlling the switching device, the control device being designed to produce the connection or the connections in the event of a transition in the output signal from a first logic level to a second logic level and to disconnect it at the latest when the output signal attains the second level.

32 Claims, 5 Drawing Sheets

CIRCUIT AND METHOD FOR GENERATING AN OUTPUT SIGNAL

CROSS-REFERENCE TO RELATED APPLICATIONS

This application claims foreign priority benefits under 35 U.S.C. §119 to co-pending German patent application number DE 10 2004 047 664.0, filed 30 Sep. 2004. This related patent application is herein incorporated by reference in its entirety.

BACKGROUND OF THE INVENTION

1. Field of the Invention

The invention relates to a circuit, in particular a memory circuit, comprising an output terminal for outputting an output signal, and to a method for generating an output signal.

2. Description of the Related Art

In present-day computer systems, the interfaces to memory components have to become faster in order to be able to transfer the increasing amount of data to be stored or read out. One important example is DRAM memory components. The latter are fabricated in a very cost-effective technology which can be used to achieve low leakage currents and which has a small number of metal planes. One disadvantage of this technology is that the driver capability of output signals at their output terminals is lower than is customary in other integrated circuits. The small area available means, moreover, that the space available for supply line systems in the integrated memory circuit is also restricted, so that the integrated supply lines can be influenced by interference and noise, as a result of which the driver capability of the integrated memory circuit is further reduced.

Interfaces of present-day DRAM memory circuits are operated with clock cycles of up to 400 MHz or more. This operating frequency is for the most part limited by the noise of the output drivers, where noise is to be understood hereafter to mean all types of disturbances that are superposed on signals. Two main sources of noise at the output drivers are the noise caused by the synchronous switching and a signal storage effect.

Even simple DRAM memory circuits have up to 32 output drivers which can switch simultaneously. The noise on account of the synchronous switching is caused by the different number of output drivers switching simultaneously. If, for example, all the output drivers switch simultaneously from a logic one to a logic zero, this causes a great level fluctuation in the supply network. This leads to a much slower signal level change or level transition than in a case in which only one of the output drivers switches from a logic one to a logic zero. As a result, noise occurs which is dependent on the transferred data and impairs the signal quality.

The signal storage effect also impairs the signal quality. The signal storage effect denotes a different switching speed in a case when a specific logic level is driven during a plurality of clock periods and is switched from said specific level to a different level, and a case when a logic level is driven only for one clock period. If switching to the other level is subsequently effected, the signal change takes place at different speeds depending on the case. In the last-mentioned case, the potential of the signal level cannot have been attained completely during the first level—in contrast to the first-mentioned case—, so that the potential of the subsequent second signal level attains the reference potential earlier and, consequently, the signal change can be carried out faster.

The noise in the supply voltage line leads to considerably vitiated data eyes and thus to a considerably vitiated signal quality.

Hitherto, in the design of integrated memory circuits attention has been given to constructing the supply lines and the output drivers such that they are of the same type as symmetrically as possible and to wiring them in an optimized manner in order to reduce the noise.

However, this does not eliminate the effects described above but merely reduces them.

SUMMARY OF THE INVENTION

One aspect of the present invention is to provide a circuit and a method for generating an output signal in order to support a transition of the output signal from a first logic level to a second logic level, and in particular to enable a faster, lower-noise and better-defined transition.

The present invention is based on the idea of supporting an output driver of a circuit in a transition of the output signal generated by the output driver from a first logic level to a second logic level by virtue of the fact that the output terminal at which the output signal is provided is occasionally connected to a suitable potential. Said suitable potential may be an output signal provided at a further output terminal by a further output driver. The further output signal preferably has an opposite logic level prior to the transition of the output signal and furthermore preferably has an inverse transition at the same time as the transition of the output signal. In this case, the two output terminals are preferably connected to one another at an earliest possible instant and disconnected again at the latest when the output signal and the further output signal have essentially matched one another or have the same potential.

If more than two output terminals are provided, they can be temporarily connected to one another in pairs by switches. Preferably, each pair of adjacent output terminals are connected to one another by a switch. In the case of a linear arrangement of the output terminals, the first and last output terminals are furthermore preferably connected to one another by a switch. Moreover, further switches may be provided. The more switches are provided, the more often it is possible to connect pairs of output terminals to one another which have opposite logic levels or have opposite logic levels and are intended to perform opposite transitions. It is optimal to provide a respective switch between each possible pair of output terminals, so that (n−1)! switches are provided given n output terminals.

As an alternative or in addition, during the transition of the output signal from the first logic level to the second logic level, the output terminal is occasionally connected to one reference potential directly via one capacitor or connected to two reference potentials via two capacitors. Appropriate reference potentials here are ground, positive or negative supply potentials, reference potentials or other, preferably constant, potentials.

Preferably, at the beginning or within each transition time duration within which transitions of the output signal or output signals between logic levels can take place, all the switches are closed and all possible connections between output terminals or between output terminals and reference potentials are thus produced. Each of these connections is preferably disconnected again when the potentials or levels of output terminals connected to one another have essentially matched one another or the level of an output terminal has matched the connected reference potential. As an alternative, each connection is disconnected again when the potential of the connected output terminal approximates to or has matched a mean level between the two logic levels.

Producing all possible connections at the beginning of each transition time duration has the advantage that, particularly if connections to reference potentials are involved, relatively defined output conditions are provided for a subsequent transition to one of the two logic levels that is driven by output drivers.

However, it is also advantageous only to connect output terminals to one another which have opposite logic levels and are intended to form opposite transitions, or to connect only those output terminals to a reference potential which are intended to have a transition from a first logic level to a second logic level. In this case, the reference potential lies between the two logic levels or is further away from the first logic level than from the second logic level. If only output terminals which are intended to perform opposite transitions are connected to one another, the power demand and energy demand of the output drivers are lower since the levels of output signals that are not intended to form a transition remain unchanged.

In this case, the output drivers are preferably activated starting from an instant shortly before or during the disconnection of the corresponding connection. The energy demand or the average power demand of the output drivers is thus minimized or at least reduced since each output driver only has to generate in each case the second section of each transition. As an alternative, the output drivers are already activated earlier or even at the beginning of each transition time duration in order to be able to realize a minimal transition time duration.

The present invention can be realized both as a circuit and as a method. A circuit according to the invention is either integrated on a chip including the output terminal or output terminals, the output driver or output drivers, the control circuit and the switches, or realized by a plurality of discrete or integrated components—for example on a circuit board.

The present invention is particularly advantageous in the case of memory circuits. Memory chips are generally realized in a technology which is optimized, inter alia, for an extremely high integration of the memory cells, but not for optimum properties of driver circuits. The advantage of the present invention in this case consists in relieving the burden on the driver circuits or reducing the requirements made of the driver circuits by virtue of accelerating the transitions between logic levels by means of the temporarily switched connections described. Furthermore, it is possible to arrange the additional switches according to the invention and a corresponding control circuit for the switches on a different chip fabricated in a technology optimized for fast circuits and/or powerful drivers. This is appropriate particularly in the case of, for example, FBDIMM memory modules (FBDIMM=fully buffered dual inline memory module). FBDIMM memory modules have a hub chip on which the switches according to the invention and the control circuit for the switches according to the invention can be arranged.

In this context, one advantageous aspect of the present invention consists in the fact that it enables a high degree of flexibility. Precisely the fabrication of memory circuits is generally subject to a high price pressure. Adaptations to a wide variety of requirements of a wide variety of applications can therefore be realized only with difficulty with regard to the resulting costs. The invention's support of the output drivers is equivalent to an adaptation of the driver strength, but does not require any modification of a memory chip since it can be effected externally with respect to the latter, for example on the hub chip mentioned.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
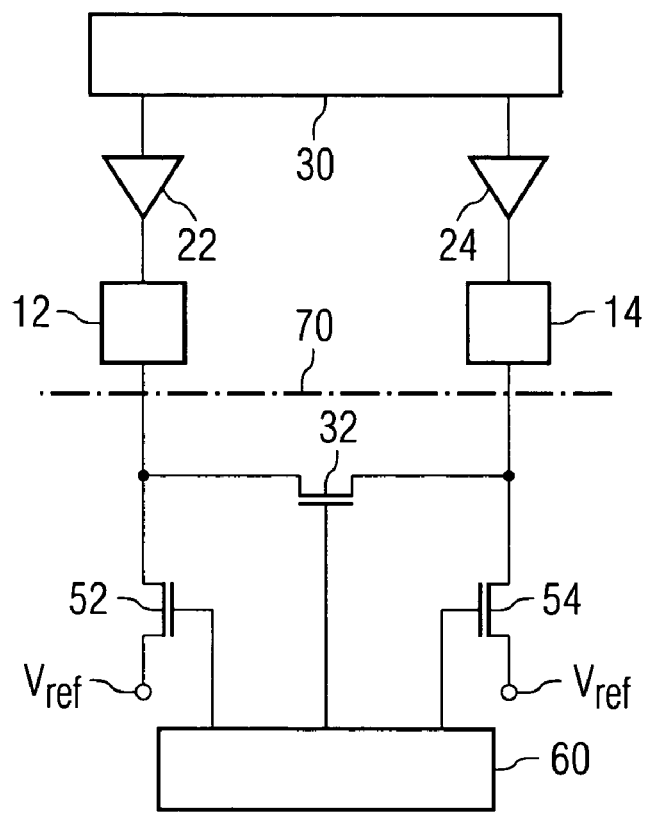
FIG. 1 shows a schematic circuit diagram of a circuit in accordance with a first exemplary embodiment of the present invention.

FIG. 1 is a schematic circuit diagram of a circuit in accordance with a first exemplary embodiment of the present invention. The circuit comprises a first output terminal 12 and a second output terminal 14. A first output driver 22 is connected to the first output terminal 12 in order to provide a first output signal at the first output terminal 12. A second output driver 24 is connected to the second output terminal 14 in order to provide a second output signal at the second output terminal 14. The output drivers 22, 24 are connected to a subcircuit 30 on the input side, from which they receive signals which they amplify and provide as T output signals at the output terminals 12, 14. The subcircuit 30 comprises for example one or more memory cell arrays, address decoders, sense amplifiers, input amplifiers and all further elements of a memory circuit. In this case, the output signals provided at the output terminals 12, 14 by the output drivers 22, 24 preferably represent data read from the memory cell array.

According to the present invention, a first field effect transistor 32 or generally a first switch is connected between the first output terminal 12 and the second output terminal 14. Furthermore, a second field effect transistor 52 or generally a second switch is connected between the first output terminal 12 and a reference potential $V_{ref}$. Furthermore, a third field effect transistor 54 or generally a third switch is connected between the second output terminal 14 and the reference potential $V_{ref}$. A control device 60 controls the field effect transistors 32, 52, 54 in accordance with a method according to the invention, which is described in more detail below.

Figure 2:
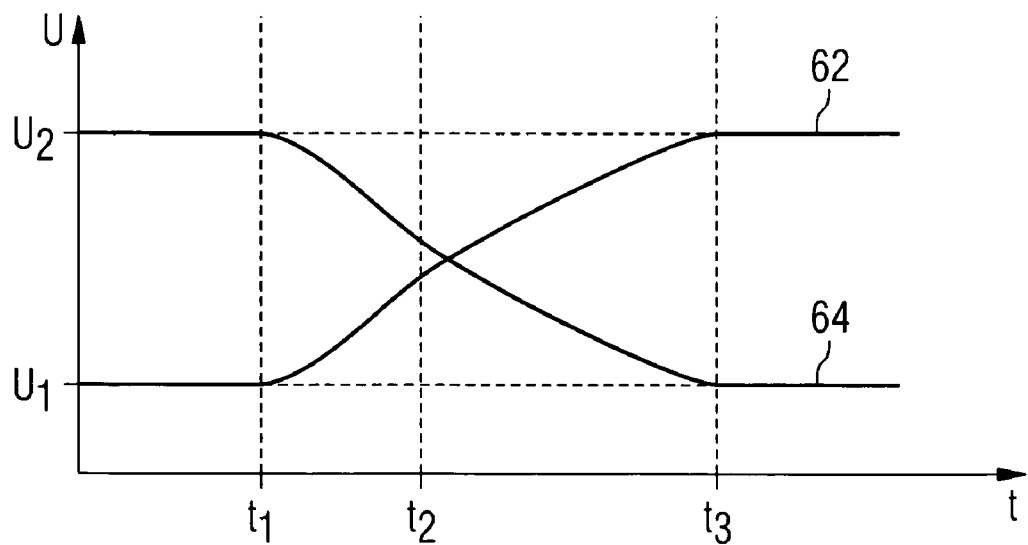
FIG. 2 shows a schematic illustration of time dependencies of output signals of the circuit from FIG. 1.

FIG. 2 is a schematic illustration of the time dependencies of the output signals provided at the output terminals 12, 14 by the output drivers 22, 24. The abscissa is assigned the time t, and the ordinate is assigned the voltage or the level U. Each of the two output signals 62, 64 can assume a first logic level $U_1$ and a second logic level $U_2$, which are preferably assigned the bit values 0 and 1.

Figure 3:
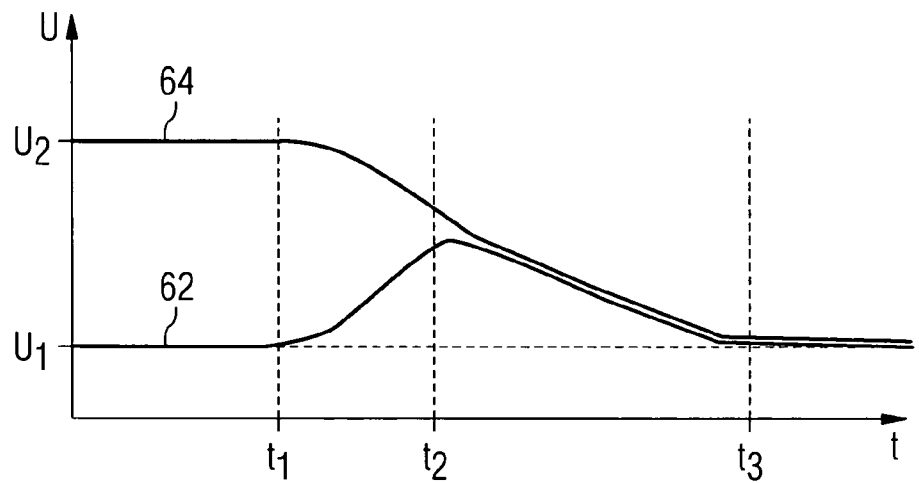
FIG. 3 shows a schematic illustration of time dependencies of output signals of a variant of the circuit from FIG. 1.
Figure 4:
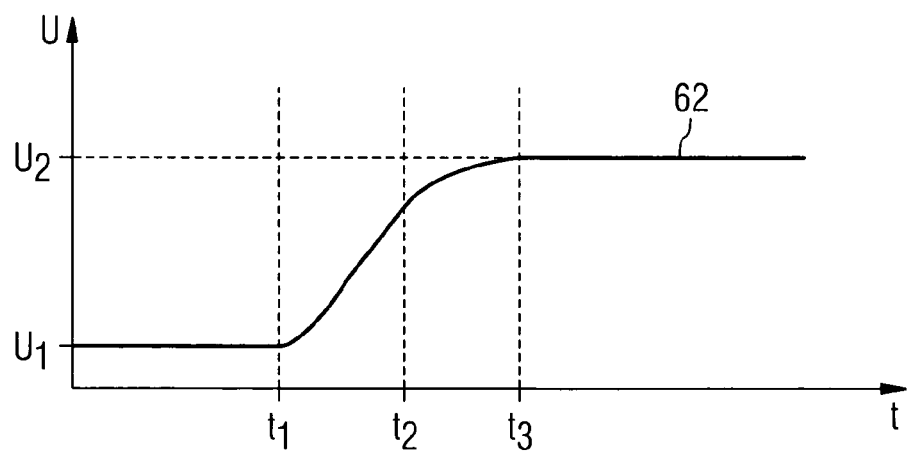
FIG. 4 shows a schematic illustration of a time dependence of an output signal of a further variant of the circuit from FIG. 1.

FIG. 2, like the subsequent FIGS. 3 and 4 as well, in this case merely illustrates an excerpt that preferably recurs periodically. Memory circuits and many other circuits are controlled by a periodic clock or a corresponding clock signal, a signal time duration within which each output signal 62, 64 has a defined potential, namely either the first logic level $U_1$ or the second logic level $U_2$, being defined within each clock period. Between two adjacent signal time durations in each case there is a transition time duration within which each output signal 62, 64 may have a transition between the two logic levels $U_1$ and $U_2$. This transition time duration extends approximately from a first instant $t_1$, defined below, up to a third instant $t_3$, likewise defined below.

Within a first time duration up to a first instant $t_1$ the first output signal 62 has the first logic level $U_1$ and the second output signal 64 has the second logic level $U_2$. After the first instant $t_1$, the first output signal 62 is intended to have a transition to the second logic level $U_2$ and the second output signal 64 is intended to have a transition to the first logic level $U_1$. For this purpose, the control device 60 drives the first field effect transistor 32 at the first instant $t_1$ in order to produce a connection between the output terminals 12, 14. The level of the first output signal 62 thereupon rises, while the level of the second output signal 64 falls. At a second instant $t_2$, the control device 60 drives the first field effect transistor 32 in order to disconnect the connection between the output terminals 12, 14. The second instant $t_2$ is advantageously chosen such that the output signals 62, 64 have precisely matched one another, or have essentially or almost completely matched one another, at the second instant $t_2$. After the second instant $t_2$, the output drivers 22, 24 drive the output signals 62, 64 in such a way that, at a third instant $t_3$, the first output signal 62 assumes the second logic level $U_2$ and the second output signal 64 assumes the first logic level $U_1$.

The same or a similar time profile is generated if the control device 60 controls, instead of the first field effect transistor 32 or in addition to the latter, the second field effect transistor 52 and the third field effect transistor 54 in order to produce connections between the output terminals 12, 14 and the reference potential $V_{ref}$ between the first instant $t_1$ and the second instant $t_2$. It is assumed in this case that the reference potential $V_{ref}$ has a mean value between the logic levels $U_1$ and $U_2$.

The production merely of a direct connection between the output terminals 12, 14 via the first field effect transistor 32 has the advantage that no interference is impressed on the reference potential $V_{ref}$. The production of connections both directly between the output terminals 12, 14 and between the output terminals 12, 14 and the reference potential $V_{ref}$ has the advantage that the levels of the output signals 62, 64 are changed particularly rapidly, or the time duration between the first instant $t_1$ and the second instant $t_2$ has a minimum length.

As a compromise it may be advantageous to produce the direct connection between the output terminals 12, 14 by means of the first field effect transistor 32 at the first instant $t_1$ and to produce the connections between the output terminals 12, 14 and the reference potential $V_{ref}$ by means of the second field effect transistor 52 and the third field effect transistor 54 only at a later instant, preferably shortly before the second instant $t_2$. As a result, on the one hand the interference impressed on the reference potential $V_{ref}$ is kept down, and on the other hand the changes of the levels are accelerated shortly before the second instant $t_2$, that is to say when the levels of the output signals differ only slightly.

In accordance with the various possibilities described above for the driving of the field effect transistors 32, 52, 54 by the control device 60, the circuit according to the invention, in a departure from FIG. 1, may advantageously have only the first field effect transistor 32 or only the second and the third field effect transistor 52, 54.

FIG. 2 reveals that the levels of the two output signals 62, 64 change particularly rapidly between the first instant $t_1$ and the second instant $t_2$. The two illustrated opposite transitions of the output signals 62, 64 between the two logic levels $U_1$ and $U_2$ are therefore effected in a significantly shorter time than is conventional.

Whereas both output signals 62, 64 have transitions between the two logic levels $U_1$ and $U_2$ in the case illustrated in FIG. 2, the above-described control of the first field effect transistor 32 and/or of the second and the third field effect transistor 52, 54 may, however, also be expedient when, although both output signals 62, 64 originally have opposite logic levels, only one of the output signals 62, 64 has a level transition.

This case is illustrated in FIG. 3. The first output signal 62 has the first logic level $U_1$ originally or before the first instant $t_1$ and is intended to have said first logic level after the third instant $t_3$ as well. The second output signal 64 has the second logic level $U_2$ originally or before the first instant $t_1$ and is intended to have the first logic level $U_1$ after the third instant $t_3$. Consequently, only the second output signal 64 is intended to have a level transition.

The control device 60 nevertheless controls the first field effect transistor 32 and/or the second and the third field effect transistor 52, 54 in accordance with one of the variants described above. The transition of the second output signal 64 from the second logic level $U_2$ to the first logic level $U_1$ is thereby accelerated. The first output signal 62 rises between the first instant $t_1$ and the second instant $t_2$ proceeding from the first logic level $U_1$ in the direction of the second logic level $U_2$ in order subsequently, by the third instant $t_3$, to be returned to the first logic level $U_1$ again by the first output driver 22.

Although the temporary raising of the level of the first output signal 62 is not necessary here, it has the advantage that both the signal storage effect described in the introduction and the noise likewise described in the introduction, on account of the synchronous switching, are suppressed or reduced. It is particularly advantageous if, at the first instant $t_1$, all the output terminals 12, 14 are always connected to the reference potential $V_{ref}$, since then all the output signals have essentially the same level at the second instant $t_2$ and all the output drivers 23, 24 and the power supply thereof are thus loaded in a well-defined and completely predictable manner between the second instant $t_2$ and the third instant $t_3$.

Therefore, it is advantageous in particular if the control device 60 connects the output terminals 12, 14 to the reference potential $V_{ref}$ between the first instant $t_1$ and the second instant $t_2$, if the assigned output signals do not have opposite levels and a direct connection of the output terminals 12, 14 by the first field effect transistor 32 therefore has no influence on the levels. In the case of a larger number of output terminals 12, 14, it is particularly advantageous if the control device 60 identifies pairs of output terminals 12, 14 and short-circuits them with one another via corresponding field effect transistors 32 whose output signals present have opposite levels. In this case, preferably all output terminals 12, 14 which cannot be short-circuited with another output terminal with an opposite logic level are connected to the reference potential $V_{ref}$.

The entire circuit according to the invention as illustrated in FIG. 1 can be integrated on a single chip or else be arranged on a plurality of chips which, by way of example, are connected to one another by conductor tracks on a circuit board. The dash-dotted separating line 70 in FIG. 1 indicates an advantageous division between two different chips. The subcircuit 30, the output drivers 22, 24 and the output terminals 12, 14 are advantageously integrated on a memory chip. This memory chip is fabricated in a technology that is optimized for a maximum degree of integration or a maximum miniaturization of the memory cells and for minimum leakage currents within the memory cells or a maximum refresh time or retention time. In this case, the control device 60 and the field effect transistors 32, 52, 54 are integrated on a hub chip, for example.

In the case of FBDIMM memory cards or FBDIMM memory modules, such a hub chip is provided in order to drive the memory chips and to buffer and/or amplify data that are to be written and read. The hub chip is preferably fabricated using a technology that is suitable or optimized for a fast logic and powerful drivers. In particular, it is possible to embody the field effect transistors 32, 52, 54 with a very low resistance in the turned-on state on the hub chip. Furthermore, the control device 60 can readily be embodied such that it realizes an optimum control of the field effect transistors 32, 52, 54 even when there are a large number of output terminals, 12, 14. In this context, an optimum control comprises for example an optimum pairwise connection of output terminals whose output signals have opposite logic levels in order to disturb the reference potential $V_{ref}$ as little as possible.

Instead of the subcircuit 30, the output drivers 22, 24 and the output terminals 12, 14, a conventional memory chip is provided in the simplest case. The circuit according to the present invention as illustrated in FIG. 1 and also its variants described above can, however, be used advantageously not only for memory circuits but also for other circuits, in particular integrated circuits, which are realized on one chip or else on a plurality of chips and/or discrete components.

In the case of the exemplary embodiment illustrated above with reference to FIGS. 1 to 3 and its variants, the reference potential $V_{ref}$ has a mean value between the logic levels $U_1$ and $U_2$. In particular $V_{ref}$ is for example the reference potential with which signals are compared in order to distinguish the two logic levels $U_1$ and $U_2$ from one another. As an alternative, the reference potential $V_{ref}$ is any other potential desired, preferably having an essentially constant value.

FIG. 4 is a schematic illustration of the time dependence of the first output signal 62 in accordance with a further variant of the exemplary embodiment illustrated above. In the case of this variant, the reference potential $V_{ref}$ has approximately the value of the second logic level $U_2$ or else a value that is even further away from the first logic level $U_1$. In the case of this variant, no connections are produced between different output terminals 12, 14. Accordingly, this variant can be realized both for a circuit which has only one output terminal 12, and for circuits which have an arbitrary plurality of output terminals 12, 14. In this case, at least one field effect transistor is connected between each output terminal and the reference potential $V_{ref}$ so that each output terminal can be connected to the reference potential $V_{ref}$ in a separately controlled manner. In the text below, reference is made only to the first output signal 62 present at the first output terminal 12.

At a first instant $t_1$, the first output signal 62 is connected to the reference potential $V_{ref}$ by virtue of the control device 60 controlling the second field effect transistor 52 correspondingly. This connection is disconnected again at a second instant $t_2$, at which the level of the first output signal 62 has approximately attained the second logic level $U_2$. Between the second instant $t_2$ and the third instant $t_3$, the first output driver 22 drives the output signal 62 to the second logic level $U_2$, thereby completing the transition between the first logic level $U_1$ and the second logic level $U_2$.

In the case of this variant, the connection between the first output terminal 12 and the reference potential $V_{ref}$ is preferably produced only when the first output signal 62 is intended to have a transition from the first logic level $U_1$ to the second logic level $U_2$. For this purpose, it is necessary for the control device 60 to know the logic level that the first output signal 62 is intended to have after the third instant $t_3$.

Therefore, this variant is preferably realized if the entire circuit is integrated on a chip and the control device receives the information about the level of the first output signal 62 after the third instant $t_3$ via additional data lines (not illustrated in FIG. 4). If the entire circuit is distributed between a plurality of chips, it is necessary to provide corresponding additional output terminals at one chip and input terminals at the other chip for these data lines.

In any variant of the second exemplary embodiment illustrated with reference to FIG. 4, the second instant $t_2$ can advantageously be set or chosen in different ways. The second instant $t_2$ is preferably chosen such that, at the second instant $t_2$, the output signal 62 has attained a level that can already be identified as a logic level or as a logic one or zero with sufficient reliability by a signal receiver. This is generally already the case if the level of the output signal has not yet completely attained the second logic level $U_2$, but rather is still a few tenths of a volt away from said second logic level.

As an alternative, the second instant $t_2$ is chosen such that the output signal 62 has already attained or even already exceeded the second logic level $U_2$. In this case, the first output driver 22 only has to hold the output signal 62 at the second logic level $U_2$ after the second instant $t_2$ and therefore has a particularly low power demand since it does not have to generate a level change.

The transition of the first output signal 62 from the first logic level $U_1$ to the second logic level $U_2$ is supported in the case illustrated with reference to FIG. 4. In order also to support the opposite transition between the second logic level $U_2$ and the first logic level $U_1$, a further reference potential may furthermore be provided, the value of which approximately corresponds to the first logic level $U_1$ or is even further away from the second logic level $U_2$. This further reference potential is connected to the first output terminal 12 by a further field effect transistor if the first output signal 62 has the second logic level $U_2$ and is intended to perform a transition to the first logic level $U_1$.

In particular, the two logic levels $U_1$, $U_2$ or else the supply potentials $V_{DD}$, $V_{SS}$ are appropriate as reference potentials; as an alternative, the reference potential $V_{ref}$ or the reference potentials are higher or substantially higher than the higher of the two logic levels $U_1$, $U_2$ or lower or substantially lower than the lower logic level $U_1$, $U_2$. The speed of the level change of the output signal is increased further as a result.

In the case of the first exemplary embodiment and the variants thereof which have been illustrated above with reference to FIGS. 1 to 4, the output drivers 22, 24 can be driven in different ways. With the aim of a fastest possible level transition, it is advantageous for the output drivers 22, 24 to be active in uninterrupted fashion, that is to say, in particular, also between the first instant $t_1$ and the second instant $t_2$. On the other hand, it is possible to obtain a significant reduction of the average power demand of the output drivers 22, 24 and also a significant reduction of the interference coupled into the supply potentials by the output drivers 22, 24 if the output drivers are deactivated at the first instant $t_1$ and activated close to the second instant $t_2$. In this case, a slight temporal overlap or an activation shortly before the second instant $t_2$ may be advantageous, depending on the configuration of the output drivers 22, 24. Particularly in the case of a control in such a way that, as has been illustrated above by way of example with reference to FIG. 3, output signals that are not intended to perform a level transition are also altered momentarily, it is expedient to activate the assigned output drivers only close to the second instant $t_2$. This prevents an output driver from having to drive a load having extremely low impedance and from taking up an extremely large amount of supply power in the process.

Each of the time sequences described above, in particular the second instant $t_2$, at which the connection or the connections is or are disconnected, and the instant at which the output driver or output drivers is or are activated, can be controlled in different ways. As an example, mention shall be made here of a purely time-dependent control in which the abovementioned instants are fixedly predefined in absolute terms or relative to one another and the control device 60 controls the field effect transistors according to a fixedly predefined temporal sequential scheme. As an alternative, by way of example, the second instant $t_2$ is chosen depending on the level of the output signal; to put it another way, the connection or the connections is or are disconnected if the output signal exceeds or falls below a defined threshold.

In accordance with a further alternative, one portion of the instants $t_1$, $t_2$, $t_3$ is defined relative to a predefined clock, while another portion of the instants $t_1$, $t_2$, $t_3$ is defined by a signal exceeding or falling below a predetermined threshold. By way of example, a connection is produced at a predetermined instant within a clock cycle and disconnected again when the output signal has attained a predetermined value. The activation of the output drivers may also be effected at an instant that is predefined in relation to a clock, or in a manner dependent on a signal level, for example the level of the output signal.

Figure 5:
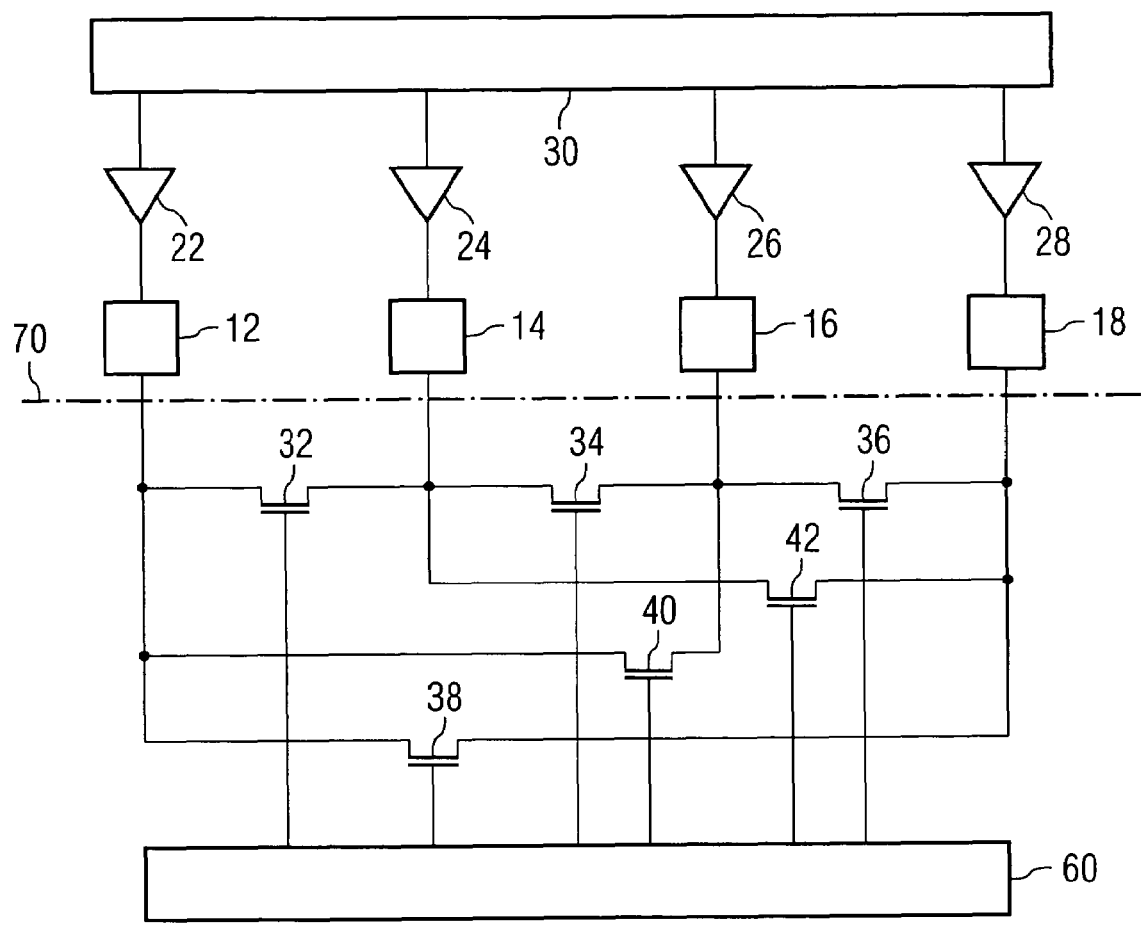
FIG. 5 shows a schematic circuit diagram of a circuit in accordance with a second exemplary embodiment of the present invention.

FIG. 5 is a schematic circuit diagram of a circuit in accordance with a second exemplary embodiment of the present invention. This exemplary embodiment differs from the one illustrated above with reference to FIG. 1 by virtue of the fact that the circuit has a larger number of output terminals 12, 14, 16, 18 at which output drivers 22, 24, 26, 28 provide output signals. In order that any desired pairs of output terminals 12, 14, 16, 18 can be connected to one another depending on the output signals present, a larger number of field effect transistors 32, 34, 36, 38, 40, 42 are provided. The latter are controlled by the control device 60. For each case in which the output signals need to be transitioned to a different level, the controller 60 preferably seeks the largest possible group of pairs of output terminals 12, 14, 16, 18 with different levels of the output signals.

In contrast to the circuit illustrated in FIG. 1, the second exemplary embodiment has no field effect transistors for producing connections between output terminals 12, 14, 16, 18 and one or more reference potentials $V_{ref}$. However, just like the exemplary embodiments illustrated below with reference to FIGS. 6 and 7, the second exemplary embodiment can be combined with all the variants illustrated above with reference to FIGS. 1 to 4. In particular, field effect transistors for producing connections to one or more reference potentials $V_{ref}$ may additionally be provided; the connections between the output terminals 12, 14, 16, 18 and/or between the output terminals 12, 14, 16, 18 and the reference potential or reference potentials may be produced independently of the levels of the output signals before the first instant $t_1$ and/or independently of the levels of the output signals after the third instant $t_3$; as an alternative, the connections are produced in such a way as to obtain a maximum speed of the level transition or a minimum time duration between the first instant $t_1$ and the third instant $t_3$ or a minimum power demand or a minimum feedback to the supply potentials or a minimum noise on account of synchronous switching or a minimum signal storage effect.

As already mentioned, the production of a connection between two output terminals at which output signals having opposite logic levels are present has, to a good approximation, no effect whatsoever on supply potentials. It is desirable, therefore, to be able to form any desired pair of output terminals 12, 14, 16, 18. For this purpose, (n−1)! field effect transistors are required given n output terminals, by means of which transistors every output terminal 12, 14, 16, 18 can be connected to every other output terminal.

Each field effect transistor 32, 34, 36, 38, 40, 42 and the associated wiring lines require chip area and increase the effective capacitance of each output terminal 12, 14, 16, 18. In order to keep the demand for chip area and the effective capacitance of the output terminals 12, 14, 16, 18 within limits, it is necessary to find a compromise. The latter may consist for example in the fact that each output terminal can only be connected to two adjacent output terminals by means of field effect transistors.

Figure 6:
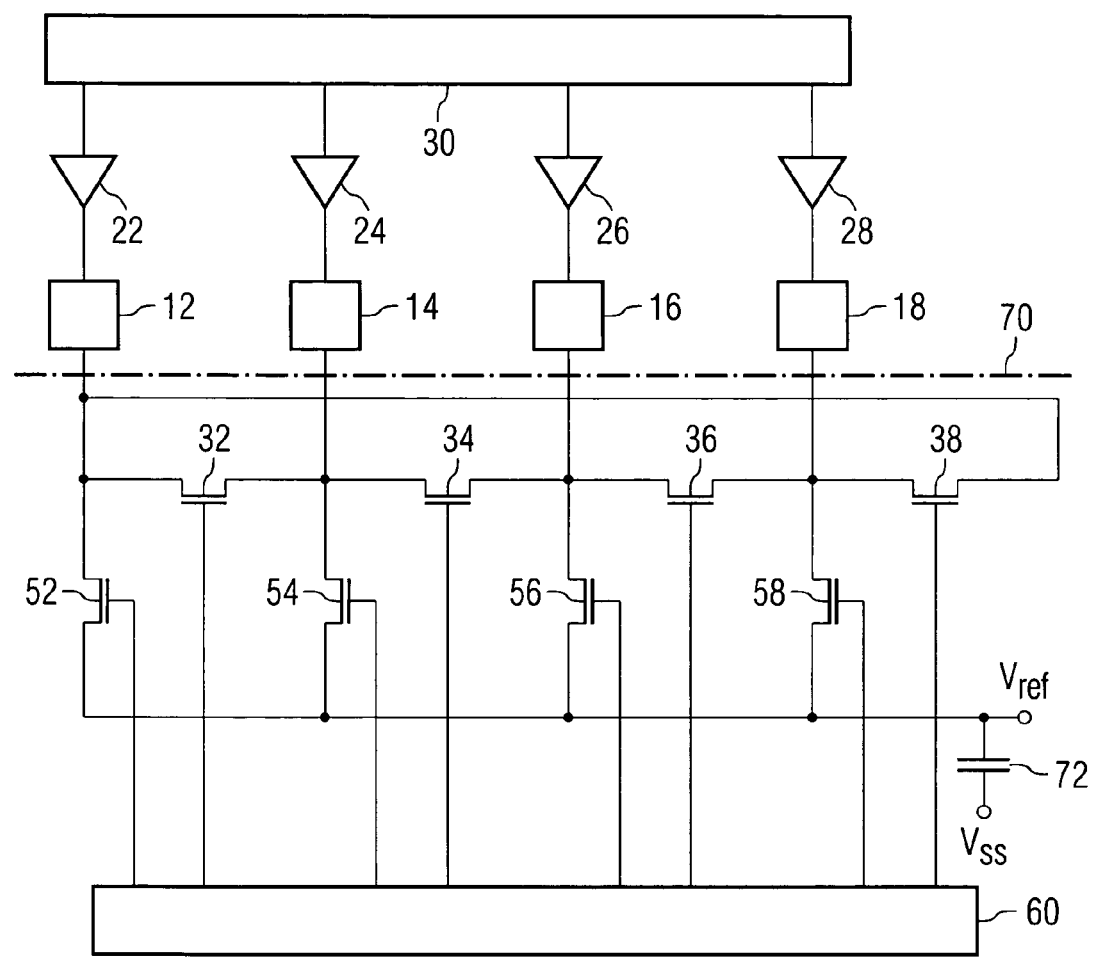
FIG. 6 shows a schematic circuit diagram of a circuit in accordance with a third exemplary embodiment of the present invention.

FIG. 6 is a schematic circuit diagram of a circuit in accordance with a third exemplary embodiment of the present invention. This exemplary embodiment differs from the second exemplary embodiment illustrated above with reference to FIG. 5 by virtue of the fact that each output terminal 12, 14, 16, 18 can only be connected to two adjacent output terminals. Output terminals 12, 18 at the ends of the linear arrangement of the output terminals have only in each case one directly adjacent output terminal 14, 16 and can therefore furthermore be connected to one another via a field effect transistor 38.

Furthermore, the third exemplary embodiment differs from the second exemplary embodiment by virtue of the fact that each output terminal 12, 14, 16, 18 can be connected to a reference potential $V_{ref}$ via a field effect transistor 52, 54, 56, 58. In order to minimize disturbing reactions upon the reference potential $V_{ref}$ a capacitor is provided between the reference potential $V_{ref}$ and a further potential, the supply potential $V_{SS}$ in this example.

Figure 7:
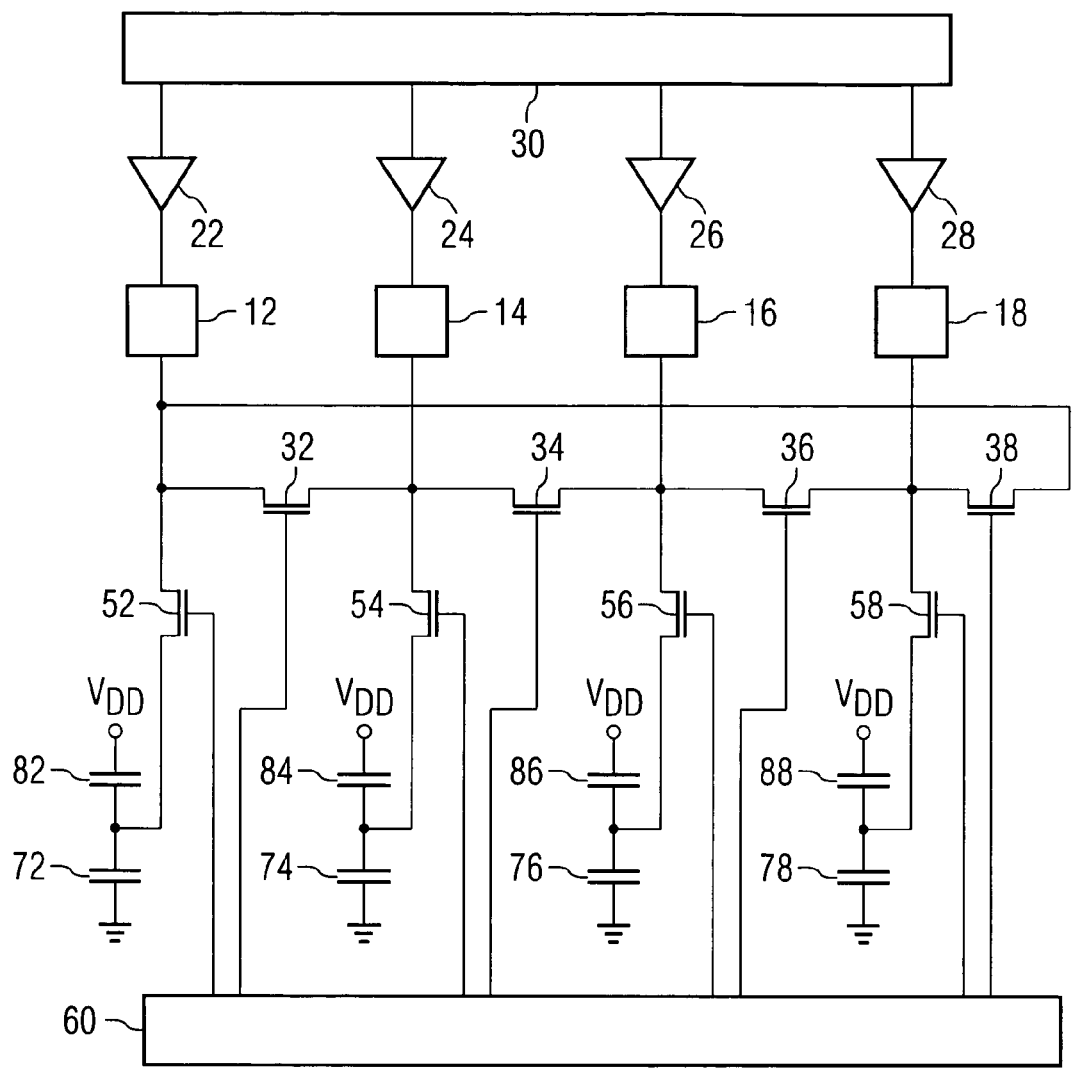
FIG. 7 shows a schematic circuit diagram of a circuit in accordance with a fourth exemplary embodiment of the present invention.

FIG. 7 is a schematic circuit diagram of a circuit in accordance with a fourth exemplary embodiment of the present invention. This exemplary embodiment differs from the third exemplary embodiment illustrated above with reference to FIG. 6 by virtue of the fact that the field effect transistors 52, 54, 56, 58 are not connected to the reference potential $V_{ref}$ via a common rail. Instead, each field effect transistor 52, 54, 56, 58 is connected to two different reference potentials via two capacitors 72, 74, 76, 78, 82, 84, 86, 88. Each output terminal 12, 14, 16, 18 can thus be connected, by means of a field effect transistor 52, 54, 56, 58, simultaneously via a first capacitor 72, 74, 76, 78 to a first reference potential, ground in this exemplary embodiment, and via a second capacitor 82, 84, 86, 88 to a second reference potential, $V_{DD}$ in this exemplary embodiment. As a result, interference and noise caused by level transitions can be distributed between the two reference potentials in order to minimize disturbing reactions and interactions between the output signals.

In the case of the exemplary embodiments illustrated above with reference to the figures, field effect transistors are provided for producing the connections. As an alternative, it is also possible to provide other integrated or discrete switches, for example bipolar transistors. By virtue of connecting in parallel in each case two or more field effect transistors or other switches, it is possible to obtain a particularly low contact resistance. All the field effect transistors 32, 34, 36, 38, 40, 42, 52, 54, 56, 58 or all the corresponding switches together are also referred to as a switching device for producing connections between the output terminals 12, 14, 16, 18 or between the output terminals 12, 14, 16, 18 and constant or variable potentials.

Figure 8:
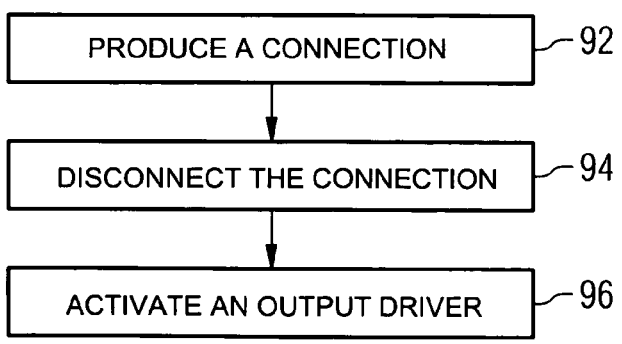
FIG. 8 shows a schematic flow diagram of a method in accordance with a further exemplary embodiment of the present invention.

FIG. 8 is a schematic flow diagram illustrating a method in accordance with a further exemplary embodiment of the present invention. This method has already been illustrated above in different variants. It is preferably controlled or carried out by the control device 60.

A first step 92 involves producing a connection of the first output terminal 12 to a fixed or variable potential in order to accelerate the transition of the first output signal 62 from a first logic level $U_1$ to a second logic level $U_2$. This step is preferably performed at the instant $t_1$ illustrated in FIGS. 2 to 4 or directly after this instant. The fixed or variable potential is for example the potential of a second output terminal 14 or a reference potential $V_{ref}$.

In a second step 94, the connection is disconnected again. This step is performed at the latest when the first output signal 62 attains the second logic level $U_2$. Furthermore, this step is preferably performed at the latest when the first output signal 62 has attained the fixed or variable potential. The instant of disconnection is denoted by $t_2$ in FIGS. 2 to 4.

In a third step 96, a first output driver 22 is activated in order to drive the first output signal 62 to the second logic level. The third step 96 is preferably performed directly before, at the same time as, or directly after the second step 94.

While the foregoing is directed to embodiments of the present invention, other and further embodiments of the invention may be devised without departing from the basic scope thereof, and the scope thereof is determined by the claims that follow.

What is claimed is:

1. A circuit, comprising:
    an output terminal;
    an output driver coupled to the output terminal and configured to produce an output signal having a desired level logic level at the output terminal; the desired level being selectable by the output driver from at least a first logic level and a second logic level;
    a switch configured to selectively connect the output terminal to a potential; and
    a switch control device configured to operate the switch and cause a connection between the output terminal and the potential in the event of a logic level at the output terminal being transitioned from the first logic level to the second logic level; wherein the output terminal, the output driver, the switch, and the switch control device are arranged on a plurality of separate chips.

2. The circuit of claim 1 wherein the output terminal and the output driver are components of a memory device.

3. The circuit of claim 1, wherein the one output terminal and the output driver are components of a memory chip and the switch control device is a component of a control chip.

4. The circuit of claim 1, wherein the control device is further configured to operate the switch to cause a disconnection of the connection at a time no later than achievement of the second logic level at the output terminal.

5. The circuit of claim 1, wherein the control device is configured to operate the switch to cause the connection upon occurrence of a first predetermined event and is further configured to terminate the connection upon occurrence of a second predetermined event.

6. The circuit of claim 5, wherein the first predetermined event is a point in time in a clock cycle.

7. The circuit of claim 5, wherein the second predetermined event is achievement of a predetermined voltage level at the output terminal after initiating the transition from the first logic level to the second logic level.

8. The circuit of claim 5, wherein the first predetermined event is a first point in time in a clock cycle and the second predetermined event is a second point in time in the clock cycle, the second point in time being after the first point in time.

9. The circuit of claim 1, further comprising a driver control device configured to activate the output driver in a manner predetermined to cooperate with the operation of the switch control device in transitioning the logic level at the output device from the first logic level to the second logic level.

10. A memory device, comprising:
    a first output terminal;
    a second output terminal;
    a first output driver coupled to the first output terminal and configured to produce a first output signal having a desired level logic level at the first output terminal; the desired level being selectable by the first output driver from at least a first logic level and a second logic level;
    a second output driver coupled to the second output terminal and configured to produce a second output signal having a desired level logic level at the second output terminal; the desired level being selectable by the second output driver from at least the first logic level and the second logic level;
    a switch configured to selectively connect the first output terminal to the second output terminal;
    a switch control device configured to operate the switch and selectively cause a connection between the first output terminal and the second output terminal at least in the event the logic levels of the respective output signals are opposite one another upon initiation of a transition of a respective logic level of at least one of the respective output signals; and
    a first driver control device coupled to the first output driver and a second driver control device coupled to the second output driver; the first and second driver control devices being configured to activate the respective output driver in a manner predetermined to cooperate with the operation of the switch control device in transitioning the respective logic level.

11. The memory device of claim 10, wherein the switch control device is configured to operate the switch to cause the connection upon occurrence of a first predetermined event and is further configured to terminate the connection upon occurrence of a second predetermined event.

12. The memory device of claim 11, wherein the first predetermined event is a point in time in a clock cycle.

13. The memory device of claim 11, wherein the second predetermined event is achievement of a predetermined voltage level of the at least one of the respective output signals initiating the transition of the respective logic level.

14. The memory device of claim 11, wherein the first predetermined event is a first point in time in a clock cycle and the second predetermined event is a second point in time in the clock cycle, the second point in time being after the first point in time.

15. The memory device of claim 10, wherein the switch control device is configured to terminate the connection when the respective voltage levels of the first and second output signal are substantially equal.

16. The memory device of claim 10, wherein the switch control device is configured to terminate the connection based upon achievement of respective voltage levels of the output signals; wherein after terminating the connection the first and second output signal are driven by the first and second output drivers, respectively, to a desired logic level of the first and second logic level.

17. The memory device of claim 10, wherein the switch control device is configured to terminate the connection based upon achievement of respective voltage levels of the output signals; wherein after terminating the connection the first and second output signal are driven by the first and second output drivers, respectively, to the same logic level at a completion of the transition.

18. The memory device of claim 10, wherein the switch control device is configured to terminate the connection based upon achievement of respective voltage levels of the output signals; wherein after terminating the connection the first and second output signal are driven by their respective output drivers to opposite logic levels, thereby placing the first and second output drivers at opposite logic levels at a completion of the transition.

19. A memory device comprising:
a first output terminal;
a second output terminal;
a first output driver coupled to the first output terminal and configured to produce a first output signal having a desired level logic level at the first output terminal; the desired level being selectable by the first output driver from at least a first logic level and a second logic level;
a second output driver coupled to the second output terminal and configured to produce a second output signal having a desired level logic level at the second output terminal; the desired level being selectable by the second output driver from at least the first logic level and the second logic level;
a switch configured to selectively connect the first output terminal to the second output terminal;
a switch control device configured to operate the switch and selectively cause a connection between the first output terminal and the second output terminal at least in the event the logic levels of the respective output signals are opposite one another upon initiation of a transition of a respective logic level of at least one of the respective output signals; and
another switch operable by the switch control device to be selectively closed thereby establishing a connection between a potential and at least one of the first and second output terminals.

20. The memory device of claim 19, wherein the potential is a reference potential.

21. A method, comprising:
driving a first output signal at a first logic level at a first output terminal;
connecting the first output terminal to a potential selected to facilitate transitioning first output signal from the first logic level to a second logic level; wherein connecting the first output terminal to the potential comprises connecting the first output terminal to a reference potential, wherein the reference potential is at a voltage level between respective voltage levels of the first and second logic levels;
disconnecting the first output terminal from the potential at a predetermined point relative to achievement of the second logic level through the transitioning; and
driving the first output signal at the second logic level achieved as a result of the transitioning.

22. A method, comprising:
driving a first output signal at a first logic level at a first output terminal;
connecting the first output terminal to a potential selected to facilitate transitioning first output signal from the first logic level to a second logic level, wherein connecting the first output terminal to the potential comprises connecting the first output terminal to a second output terminal driven at the second logic level by a second output signal;
disconnecting the first output terminal from the potential at a predetermined point relative to achievement of the second logic level through the transitioning; and driving the first output signal at the second logic level achieved as a result of the transitioning; wherein connecting the first output terminal to the potential comprises connecting the first output terminal to a second output terminal driven at the second logic level by a second output signal.

23. The method of claim 22, wherein disconnecting the first output terminal from the potential is done when a respective voltage levels of the first and second output signals are substantially equal.

24. The method of claim 22, wherein disconnecting the first output terminal from the potential is done when at a predetermined time of a clock cycle.

25. A memory device, comprising:
a plurality of output terminals;
a plurality of output drivers each coupled to a respective one of the output terminals and configured to produce a respective output signal having a desired level logic level at the respective output terminal; the desired level being selectable by the respective output driver from at least a first logic level and a second logic level;
a plurality of switches configured to selectively connect a respective first one of the output terminals to a respective second one of the output terminals; and
a switch control device configured to operate the plurality of switches; wherein the switch control device is configured to facilitate a transition of the logic levels of a least a portion of the output signals by identifying those output signals having opposite logic levels and causing a connection between the respective output terminals driven by the identified output signals; wherein the switch control device is further configured to couple a remaining portion of the output signals not having opposite logic levels to a respective potential.

26. The memory device of claim 25, wherein the switch control device is configured to disconnect the respective connections upon achieving a predefined voltage level at the respective output terminals driven by the identified output signals.

27. The memory device of claim 25, wherein the switch control device is configured to disconnect the respective connections at a predetermined point in time in a clock cycle.

28. A hub chip, configured to be connected to a plurality of memory chips comprising:
   an input terminal configured to be coupled to an output terminal of a memory chip;
   a switch configured to selectively connect the input terminal to a potential; and
   a switch control device configured to operate the switch and cause a connection between the input terminal and the potential in the event of a logic level at the input terminal being transitioned from the first logic level to the second logic level; wherein the input terminal, the switch, and the switch control device are arranged on a plurality of chips.

29. The circuit of claim 28, wherein the control device is configured to operate the switch to cause the connection upon occurrence of a first predetermined event and is further configured to terminate the connection upon occurrence of a second predetermined event.

30. The circuit of claim 29, wherein the first predetermined event is a point in time in a clock cycle.

31. The circuit of claim 29, wherein the second predetermined event is achievement of a predetermined voltage level at the output terminal after initiating the transition from the first logic level to the second logic level.

32. The circuit of claim 29, wherein the first predetermined event is a first point in time in a clock cycle and the second predetermined event is a second point in time in the clock cycle, the second point in time being after the first point in time.

* * * * *